United States Patent
Liang et al.

(10) Patent No.: US 12,402,467 B2
(45) Date of Patent: Aug. 26, 2025

(54) PEROVSKITE SOLAR CELL, PREPARATION METHOD THEREFOR AND POWER CONSUMING DEVICE

(71) Applicant: CONTEMPORARY AMPEREX TECHNOLOGY (HONG KONG) LIMITED, Hong Kong (CN)

(72) Inventors: Weifeng Liang, Ningde (CN); Juanjuan Sun, Ningde (CN); Bao Tu, Ningde (CN); Changsong Chen, Ningde (CN); Yongsheng Guo, Ningde (CN); Guodong Chen, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 0 days.

(21) Appl. No.: 18/313,394

(22) Filed: May 8, 2023

(65) Prior Publication Data
US 2023/0320109 A1    Oct. 5, 2023

Related U.S. Application Data

(63) Continuation of application No. PCT/CN2021/143771, filed on Dec. 31, 2021.

(51) Int. Cl.
*H10K 30/20* (2023.01)
*H10K 30/82* (2023.01)
(Continued)

(52) U.S. Cl.
CPC .............. *H10K 30/20* (2023.02); *H10K 30/82* (2023.02); *H10K 30/85* (2023.02); *H10K 30/88* (2023.02);
(Continued)

(58) Field of Classification Search
CPC ........ H10K 30/20; H10K 30/88; H10K 30/85; H10K 30/82; H10K 71/40; H10K 85/111; H10K 85/50
See application file for complete search history.

(56) References Cited

U.S. PATENT DOCUMENTS

2021/0159022 A1    5/2021    Irwin et al.

FOREIGN PATENT DOCUMENTS

| CN | 105900255 A | 8/2016 |
| CN | 106062983 B | 3/2019 |

(Continued)

OTHER PUBLICATIONS

Wang, Feng et al., Phenylalkylamine Passivation of Organolead Halide Perovskites Enabling High-Efficiency and Air-Stable Photovoltaic Cells, Sep. 28, 2016, Advanced Materials, vol. 28, pp. 9986-9992 (Year: 2016).*

(Continued)

*Primary Examiner* — Jayne L Mershon
(74) *Attorney, Agent, or Firm* — K&L Gates LLP

(57) ABSTRACT

A perovskite solar cell, a preparation method therefor and a power consuming device are provided. In some embodiments, the perovskite solar cell of the present application has, in order, a back electrode, a hole transport layer, an interface passivation layer, a perovskite layer, an interface passivation layer, an electron transport layer, and conductive glass, wherein the HOMO energy level of an interface between the perovskite layer and the interface passivation layer is 0.01-0.4 eV, and the energy band gap between the HOMO energy level and the LUMO energy level is 0.01-0.4 eV; and the interface passivation layer contains: an organic amine salt of a biphenyl compound and/or an organic amine salt of an acene compound. In the perovskite solar cell according to the present application, by passivating the (Continued)

perovskite layer therein with an organic amine salt of a biphenyl compound or acene compound, the VBM of the perovskite layer is improved, facilitating the extraction of holes, and the transport efficiency of carriers is improved, so that the efficiency and stability of the perovskite solar cell can be greatly improved.

12 Claims, 4 Drawing Sheets

(51) Int. Cl.
    *H10K 30/85*      (2023.01)
    *H10K 30/88*      (2023.01)
    *H10K 71/40*      (2023.01)
    *H10K 85/10*      (2023.01)
    *H10K 85/50*      (2023.01)
    *H10K 101/30*      (2023.01)
    *H10K 101/40*      (2023.01)

(52) U.S. Cl.
    CPC ........... *H10K 71/40* (2023.02); *H10K 85/111* (2023.02); *H10K 85/50* (2023.02); *H10K 2101/30* (2023.02); *H10K 2101/40* (2023.02)

(56) References Cited

FOREIGN PATENT DOCUMENTS

| | | | |
|---|---|---|---|
| CN | 111540808 | A | 8/2020 |
| CN | 110635039 | B | 1/2021 |
| CN | 112864325 | A | 5/2021 |
| CN | 113363390 | A | 9/2021 |
| CN | 113809246 | * | 12/2021 |
| CN | 113809246 | A | 12/2021 |
| WO | 2021241554 | A1 | 12/2021 |

OTHER PUBLICATIONS

Degani et al. (Efficient Inverted Perovskite Solar Cells by Dual Interfacial Modification), Science Advances, Research Article, Materials Science, pp. 7-9, Dec. 1, 2021 (Year: 2021).*
Ackman et al., Poly(N, N'-bis-4-butylphenyl-N, N'-bisphenyl)benzidine-Based Interfacial Passivation Strategy Promoting Efficiency and Operational Stability of Perovskite Solar Cells in Regular Architecture, Advanced Materials, vol./Issue 33, pp. 1-9 (Year: 2021).*
Zhuang et al., Interfacial Passivation for Perovskite Solar Cells: The Effects of the Functional Group in Phenethylammonium Iodide, ACS Energy Letters, pp. 2913-2021 (Year: 2019).*
Chen et al., In Situ Growth of 2D Perovskite Capping Layer for Stable and Efficient Perovskite Solar Cells, Adv. Funct. Mater. 28, 1706923, pp. 1-10 (Year: 2018).*
Zhang et al., Enhanced performance and light soaking stability of planar perovskite solar cells using an amine based fullerene interfacial modifier, Journal of Materials Chemistry A, vol./Issue 4, pp. 18509-18515 (Year: 2016).*
The Extended European Search Report received in the corresponding European Application 21960111.9, mailed on Nov. 24, 2023.
Su Pei-Yang et al: "A multifunctional poly-N-vinylcarbazole interlayer in perovskite solar cells for high stability and efficiency: a test with new triazatruxene-based hole transporting materials", Journal of Materials Chemistry A, vol. 5, No. 5, Dec. 19, 2016 (Dec. 19, 2016), pp. 1913-1918, XP93099629 * p. 1915, col. 2, line 19-line 34; figures 1,2,5 *.
Zhou Qin et al: "Fluoroaromatic Cation-Assisted Planar Junction Perovskite Solar Cells with Improved V OC and Stability: The Role of Fluorination Position", Solar RRL, vol. 4, No. 7, May 13, 2020 (May 13, 2020), XP93100024 * p. 2, col. 2, line 35-line 46; figures 1,2a * * p. 8, col. 1, line 15-col. 2, line 9 *.
Yu Huanqin et al: "In-situ fluorinated 2D/3D invert perovskite film solar cell ith enhanced ambient stability", Solar Energy, Elsevier, Amsterdam, NL, vol. 221, May 12, 2021 (May 12, 2021), pp. 583-590, XP086585279 * p. 584, col. 2, line 1-line 26; figures 6a,7a *.
International Search Report received in the corresponding International Application PCT/CN2021/143771, mailed Sep. 29, 2022.
Feng Wang et al., "Phenylalkylamine Passivation of Organolead Halide Perovskites Enabling High-Efficiency and Air-Stable Photovoltaic Cells", Advanced Materials, Sep. 28, 2016; vol. 28, ISSN: 0935-9648, p. 9986 Right Column Line 10 to p. 9992 Left Column Line 8.
The Office Action received in the counterpart EP Application 21960111.9, dated Jul. 4, 2025, 7 pages.
Liang Lusheng et al: "Efficient Perovskite Solar Cells by Reducing Interface-Mediated Recombination: a Bulky Amine Approach", Advanced Energy Materials, vol. 10, No. 14, Feb. 21, 2020 (Feb. 21, 2020), XP093115837,Weinheim ISSN: 1614-6832, DOI: 10.1002/aenm.202000197 Retrieved from the Internet: URL:https://onlinelibrary.wiley.com/doi/full-xml/10.1002/aenm.202000197.

* cited by examiner

Preparation of perovskite layer and passivation layer

PEROVSKITE SOLAR CELL, PREPARATION METHOD THEREFOR AND POWER CONSUMING DEVICE

CROSS REFERENCE TO RELATED APPLICATIONS

The present application is a continuation of International Application PCT/CN2021/143771, filed Dec. 31, 2021 and entitled "PEROVSKITE SOLAR CELL, PREPARATION METHOD THEREFOR AND POWER CONSUMING DEVICE", the entire disclosure of which is incorporated herein by reference.

TECHNICAL FIELD

The present application relates to the field of cells, in particular to a perovskite solar cell, a preparation method therefor and a power consuming device.

BACKGROUND ART

In existing perovskite solar cells, passivation materials such as thiophene compounds, pyridine compounds, cyclic ether compounds and fullerene are used to passivate perovskite surface, so as to improve the photoelectric conversion efficiency of perovskite solar cells.

However, the passivation materials with monocyclic organic small molecular structures such as thiophene compounds, pyridine compounds and cyclic ether compounds can only simply achieve an interface passivation effect and cannot solve the problem of deep and shallow energy level defects existing during the preparation of perovskite solar cells and the operation of devices, and these defects may seriously affect the efficiency and long-term stability of the cells.

Moreover, when materials such as fullerene are used, the structures thereof have relatively large steric hindrance, which leads to recombination of carriers and seriously affects the performance of devices.

SUMMARY OF THE INVENTION

The applicant has found that organic amine salts of biphenyl compounds and acene compounds can not only well passivate defects on the surface of perovskite, but can also realize energy level adjustment, and therefore, the efficiency and stability of a perovskite solar cell can be greatly improved.

Therefore, the present application is made in view of the above-mentioned technical problems, and an object thereof is to provide a perovskite solar cell, a preparation method therefor, and a power consuming device, such that the cell performance and long-term stability of the perovskite solar cell can be significantly improved.

In order to achieve the above object, a first aspect of the present application is to provide a perovskite solar cell, wherein the perovskite solar cell has, in order, a back electrode, a hole transport layer, an interface passivation layer, a perovskite layer, an interface passivation layer, an electron transport layer, and conductive glass, wherein the HOMO energy level of an interface between the perovskite layer and the interface passivation layer is 0.01-0.4 eV, and the energy band gap between the HOMO energy level and the LUMO energy level is 0.01-0.4 eV; and the interface passivation layer contains: an organic amine salt of a biphenyl compound and/or an organic amine salt of an acene compound.

By adjusting the energy level of perovskite with a multi-benzene structure, the HOMO energy level can be improved, while the LUMO energy level changes little.

In some embodiments, the organic amine salt of the biphenyl compound has one or more selected from biphenyl, o-terphenyl, m-terphenyl and p-terphenyl, as a parent nucleus. When using a multi-benzene structure to adjust the energy level of perovskite, with the increase of the number of benzene rings, the expanded π conjugated system (or π range) increases the number of coupled molecular orbitals and enhances the degree of π delocalization, so the HOMO energy level increases, while the LUMO energy level changes little.

In some embodiments, the organic amine salt of the acene compound has one or more selected from naphthalene, anthracene, phenanthrene, tetracene and pentacene, as a parent nucleus. When using a multi-benzene structure to adjust the energy level of perovskite, with the increase of the number of benzene rings, the expanded π conjugated system (or π range) increases the number of coupled molecular orbitals and enhances the degree of π delocalization, so the HOMO energy level increases, while the LUMO energy level changes little.

In some embodiments, the organic amine salt of the biphenyl compound and/or the organic amine salt of the acene compound further has an electron-donating group, an electron-withdrawing group and an alkylamine. By introducing different electron-withdrawing and electron-donating functional groups into the parent nucleus, the energy level can be adjusted.

The electron-donating group is one or more selected from a superstrong electron-donating group, a strong electron-donating group, a medium electron-donating group and a weak electron-donating group, wherein
the superstrong electron-donating group is oxo,
the strong electron-donating group is dialkylamino, alkylamino, amino, hydroxyl or alkoxy, wherein the alkyl has a carbon atom number of 1-10,
the medium electron-donating group is an amide group or acyloxy, and
the weak electron-donating group is alkyl, carboxymethyl, or phenyl; and
the electron-withdrawing group is one or more selected from a strong electron-withdrawing group, a medium electron-withdrawing group and a weak electron-withdrawing group, wherein
the strong electron-withdrawing group is tertiary amino, nitro or trihalomethyl,
the medium electron-withdrawing group is cyano or a sulfonic acid group, and
the weak electron-withdrawing group is acyl or carboxyl.

The electron-donating group can improve the HOMO energy level thereof, while the electron-withdrawing group can reduce the LUMO energy level thereof. By means of cooperation with different groups, the energy level position and band gap thereof can be adjusted. By adjusting the energy level of this molecule, the electronic structure of the perovskite surface can be adjusted, and the energy level of perovskite is thus adjusted to make it more match with the energy level of the hole transport layer.

In some embodiments, the organic amine salt of the biphenyl compound and/or the organic amine salt of the acene compound further has one or more selected from sulfonate ion, nitrate ion, acetate ion, phosphate ion, fluoride ion, iodide ion, bromide ion and chloride ion, as an anion. On the one hand, the anion can improve the electrostatic interaction with the cation; on the other hand, it can improve the bonding ability with the A and B positions in the perovskite layer so as to stabilize the structure of the perovskite layer.

A second aspect of the present application is to provide a method for preparing a perovskite solar cell, wherein the method for preparing a perovskite solar cell comprises, in order, (I) a process of preparing an electron transport layer, (II) a process of preparing a perovskite layer and a passivation layer, (III) a process of preparing a hole transport layer, and (IV) a process of preparing a back electrode, such that the perovskite solar cell of the first aspect is prepared, wherein the (II) process of preparing the perovskite layer and the passivation layer comprises (1) respectively preparing a perovskite precursor solution and an anti-solvent solution of an interface passivation material;

(2) on conductive glass spun-coated with the electron transport layer, initially dripping the perovskite precursor solution for spin coating, and then dripping the anti-solvent solution of the interface passivation material for spin coating in a synchronous manner; and (3) performing annealing to form the perovskite layer and the passivation layer.

In some embodiments, in process (1), the perovskite precursor is dissolved in a solvent to obtain a perovskite precursor solution, wherein the perovskite precursor comprises: one or more selected from CsBr, FABr, MABr, CsI, FAI, MAI, CsCl, FACl, and MACl; and one or more selected from $PbBr_2$, $SnBr_2$, $PbI_2$, $SnI_2$, $PbCl_2$ and $SnCl_2$, wherein the solvent is one or more selected from DMF, DMSO, NMP and GBL. These solvents can effectively dissolve the perovskite precursor to obtain a perovskite precursor solution.

In some embodiments, in process (1), the interface passivation material is dissolved in an anti-solvent to obtain an anti-solvent solution of the interface passivation material, wherein the anti-solvent is one selected from toluene, chlorobenzene, dichlorobenzene, ethyl acetate and diethyl ether.

The anti-solvent solution of the interface passivation material formed by adding the interface passivation material to the anti-solvent can reduce the tedious process of preparing the interface passivation layer and avoid the influence of multiple annealing on each layer. In addition, the interface passivation material can better bond with the perovskite layer at the interface to stabilize the perovskite layer, can passivate the grain boundary and surface of the perovskite layer at the same time, and can prevent carriers from recombination at the grain boundary and interface.

In some embodiments, in the anti-solvent solution of the interface passivation material, one or more selected from benzene, anhydrous ethanol, isopropanol, butanol, chloroform, methyl butyrate, anisole, xylene and trimethylbenzene is further added as an additional solvent.

In some embodiments, in the anti-solvent solution of the interface passivation material, the concentration of the interface passivation material is 0.1-40 mmol/L. If the concentration of the interface passivation material exceeds 40 mmol/L, since the passivation material is an organic small molecule, the band gap is relatively wide, and if it is relatively thick, it is difficult for carriers to pass through, resulting in a reduced current; and if the concentration is lower than 0.1 mmol/L, when there are too many defects on the surface of perovskite, it is difficult for the low concentration passivation material to completely passivate the defects thereof. Therefore, by keeping the concentration of the interface passivation material in the range of 0.1-40 mmol/L, not only can the detects thereof be completely passivated, but also difficult tunneling by carriers due to the excessively thick passivation material can be avoided.

In some embodiments, in process (2), the spin coating period for the perovskite precursor solution is 10-120 seconds. If the spin coating period for the perovskite precursor solution exceeds 120 seconds, the perovskite layer is too thin to sufficiently absorb sunlight, resulting in an excessively low current; and if the spin coating period is less than 10 seconds, the thickness of a wet film is too high, which makes it difficult for perovskite to achieve relatively good crystallization. Therefore, by keeping the spin coating period for the perovskite precursor solution in the range of 10-120 seconds, the perovskite can fall into a suitable thickness range, and a perovskite thin film with better crystal quality can be obtained, which is neither too thin to absorb sunlight nor too thick to cause much poor perovskite crystal.

In some embodiments, in process (2), during the process of spin coating with the perovskite precursor solution, the anti-solvent solution of the interface passivation material is dripped.

In some embodiments, before the annealing in process (3), pre-annealing is optionally performed, wherein the pre-annealing temperature is 60-150° C., and the pre-annealing time is 30 min or less. If the pre-annealing temperature exceeds 150° C., the perovskite and the passivation material decompose due to high temperature intolerance; and if the pre-annealing temperature is lower than 60° C., difficult solvent volatilization occurs, which makes it difficult to spread the next layer. Therefore, by keeping the pre-annealing temperature in the range of 60-150° C., the solvent can be completely volatilized, and the passivation material can be well spread on the perovskite surface without affecting the perovskite phase. Furthermore, if the pre-annealing time exceeds 30 min, the perovskite will begin to decompose, so it will be 30 min or less.

In some embodiments, in process (3), the annealing temperature is 100-200° C., and the annealing time is 10-120 min. If the annealing temperature exceeds 200° C., the perovskite phase do not decompose due to high temperature intolerance; and if the annealing temperature is lower than 100° C., it will be difficult to form a. perovskite phase that can realize photoelectric conversion. Therefore, by keeping the annealing temperature in the range of 100-200° C., high-quality crystal perovskite can be obtained. Moreover, if the annealing time exceeds 120 min, the perovskite will begin to decompose; and if the annealing time is less than 10 min, the solvent is difficult to volatilize completely, and the perovskite phase with photoelectric conversion is difficult to form. Therefore, by keeping the annealing time in the range of 10-120 min, a high-quality perovskite layer can be obtained.

In some embodiments, in the (I) process of preparing the electron transport layer, the electron transport layer material solution is spun-coated on the surface of conductive glass and then annealed to obtain the electron transport layer.

In some embodiments, in the (III) process of preparing the hole transport layer, the hole transport layer material solution is spun-coated on the surface of the perovskite layer and the passivation layer to obtain the hole transport layer.

In some embodiments, in the (IV) process of preparing the back electrode, an electrode position is scraped and evaporated with silver to obtain the back electrode.

A third aspect of the present application is to provide a power consuming device. The power consuming device has the perovskite solar cell according to the first aspect of the present application as a power source or energy storage unit of the power consuming device.

The perovskite solar cell according to the present application can not only well passivate defects on the surface of perovskite, but can also realize energy level adjustment, and therefore, the efficiency and stability of the perovskite solar cell can be greatly improved.

BRIEF DESCRIPTION OF THE DRAWINGS

FIG. 4a is an SEM image of a passivation layer according to another embodiment of the present application, and FIG. 4b is a partial enlarged view of FIG. 4a.

DETAILED DESCRIPTION OF EMBODIMENTS

Figure 1:
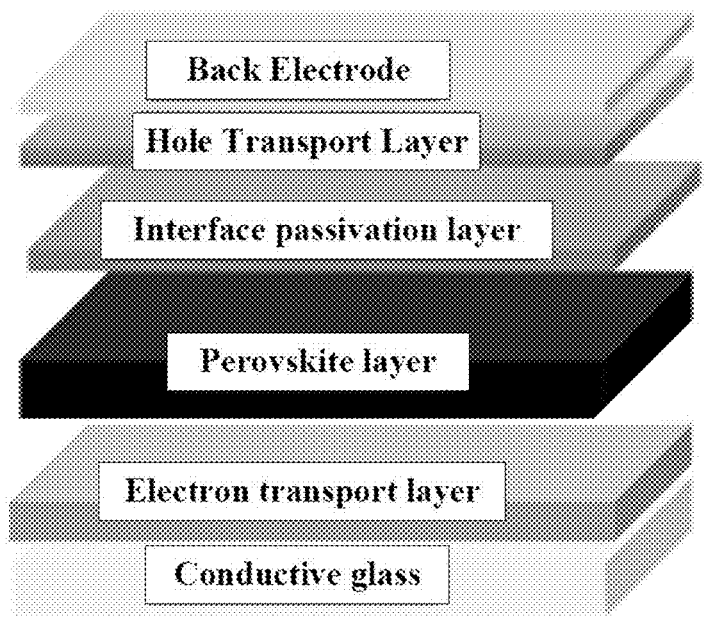
FIG. 1 is a structural schematic diagram of a perovskite solar cell according to one embodiment of the present application.

Hereinafter, embodiments of the perovskite solar cell, preparation method therefor, battery module, battery pack and electrical device of the present application are disclosed in detail appropriately with reference to the detailed description of the drawings. However, unnecessary detailed illustrations may be omitted in some instances. For example, there are situations where detailed description of well known items and repeated description of actually identical structures are omitted. This is to prevent the following description from being unnecessarily verbose, and facilitates understanding by those skilled in the art. Moreover, the accompanying drawings and the descriptions below are provided for enabling those skilled in the art to fully understand the present application, rather than limiting the subject matter disclosed in claims.

"Ranges" disclosed in the present application are defined in the form of lower and upper limits, and a given range is defined by selection of a lower limit and an upper limit, the selected lower and upper limits defining the boundaries of the particular range. Ranges defined in this manner may be inclusive or exclusive, and may be arbitrarily combined, that is, any lower limit may be combined with any upper limit to form a range. For example, if the ranges of 60 to 120 and 80 to 110 are listed for a particular parameter, it should be understood that the ranges of 60 to 110 and 80 to 120 are also contemplated. Additionally, if the minimum range values 1 and 2 are listed, and the maximum range values 3, 4, and 5 are listed, the following ranges are all contemplated: 1-3, 1-4, 1-5, 2-3, 2-4 and 2-5. In the present application, unless otherwise stated, the numerical range "a-b" represents an abbreviated representation of any combination of real numbers between a and b, wherein a and b are both real numbers. For example, the numerical range "0-5" means that all real numbers between "0-5" have been listed herein, and "0-5" is just an abbreviated representation of combinations of these numerical values. In addition, when a parameter is expressed as an integer of ≥2, it is equivalent to disclosing that the parameter is, for example, an integer of 2, 3, 4, 5, 6, 7, 8, 9, 10, 11, 12, etc.

All the embodiments and optional embodiments of the present application can he combined with one another to form new technical solutions, unless otherwise stated.

All the technical features and optional technical features of the present application can be combined with one another to form a new technical solution, unless otherwise stated.

The terms "comprise" and "include" mentioned in the present application are open-ended or closed-ended, unless otherwise stated. For example, the terms "include" and "comprise" may mean that other components not listed may also he included or comprised, or only the listed components may be included or comprised.

In the present application, the term "or" is inclusive unless otherwise specified. For example, the phrase "A or B" means "A, B, or both A and B". In more particular, the condition "A or B" is satisfied by any one of the following: A is true (or present) and B is false (or not present); A is false (or not present) and B is true (or present); or both A and B are true (or present).

Perovskite Solar Cell

Referring to FIG. 1, the perovskite solar cell of the present application can be made up of, in order from top to bottom, a (metal) back electrode, an electron/hole transport layer, a passivation layer, a perovskite layer, a passivation layer, a hole/electron transport layer, and conductive glass.

In the perovskite solar cell of the present application, the surface of the perovskite layer is passivated by an interface passivation material to form an interface passivation layer, wherein the HOMO energy level of an interface between the perovskite layer and the interface passivation layer is 0.01-0.4 eV, and the energy band gap between the HOMO energy level and the LUMO energy level is 0.01-0.4 eV; and the interface passivation material contains: an organic amine salt of a biphenyl compound and/or an organic amine salt of an acene compound.

Figure 2:
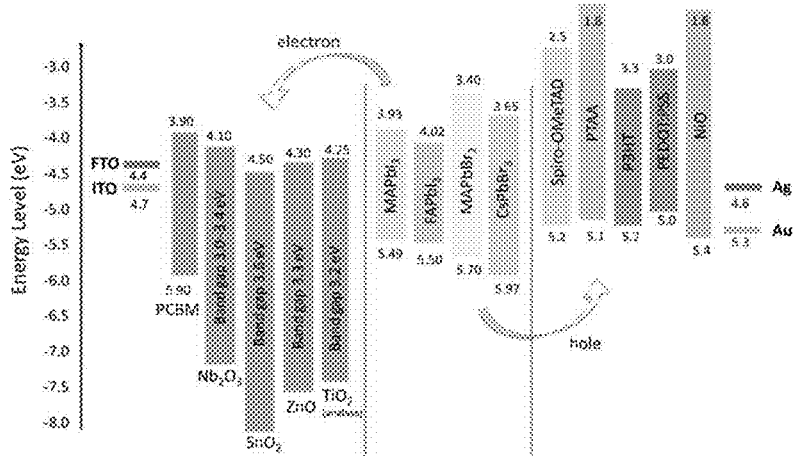
FIG. 2 is an energy level diagram of a perovskite solar cell according to another embodiment of the present application.

Referring to FIG. 2, taking FAPbI3 (perovskite layer) and Spiro (hole transport layer) for example, the VBMs of the two are respectively −5.5 and −5.2, and a larger energy level difference leads to a decrease in open circuit voltage. However, the use of the organic amine salts of biphenyl compounds and/or organic amine salts of acene compounds increase the VBM of the perovskite layer, which is beneficial for the extraction of holes and improve the transport efficiency of carriers.

In the present application, the biphenyl compounds include biphenyl, o-terphenyl, m-terphenyl and p-terphenyl, and the structural formulas thereof are as follows: in order from left to right,

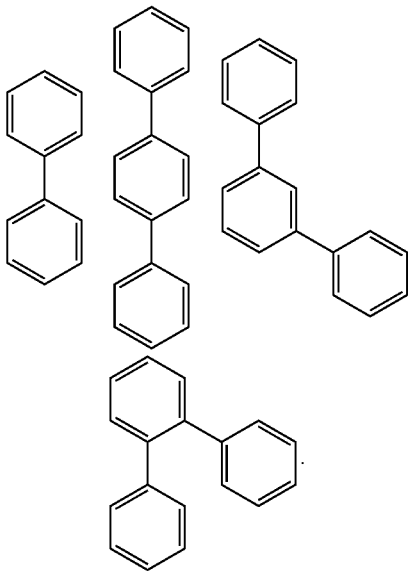

In the present application, the acene compounds include naphthalene, anthracene, phenanthrene, tetracene and pentacene, and the structural formulas thereof are as follows: in order from left to right,

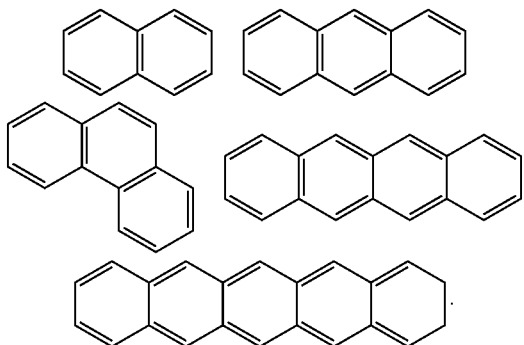

Existing interface passivation materials are effective in improving the efficiency and stability of cells to a certain extent. By contrast, it has been found that organic ammonium salts composed of biphenyl compounds and acene compounds more significantly, improve the performance and long-term stability of cells.

Figure 3:
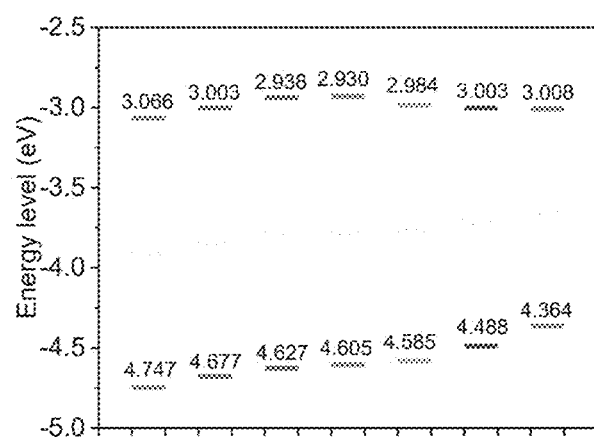
FIG. 3 is an energy level diagram of an interface passivation material according to yet another embodiment of the present application.

In particular, the biphenyl compounds and acene compounds are both compounds with multi-benzene rings. By using multi-benzene rings, the valence band energy level position of the surface of organic hybrid perovskite can be improved, providing more excellent energy level matching with the hole transport layer, which is conducive to carrier transport and improves the cell efficiency. Referring to FIG. 3, by using an interface passivation material with a multi-benzene structure to adjust the energy level of perovskite, with the increase of the number of benzene rings, the expanded π conjugated system (or π range) increases the number of coupled molecular orbitals and enhances the degree of π delocalization, so the HOMO energy level increases, while the LUMO energy level changes little.

The energy level detection method involves using ultraviolet photoelectron spectroscopy (UPS). After characterization by a device, the energy level position thereof is calculated by the Fermi edge and cut-off edge thereof. In addition, a UV-V is spectrophotometer is used to measure the spectral absorption thereof, and the band gap thereof is measured according to formula transformation.

Furthermore, the introduction of the multi-benzene rings into the biphenyl compounds and acene compounds as electron-donating functional groups can not only, improve the bonding energy of the interface passivation material at defect sites, but can also enhance the proton bonding capacity of the interface passivation material itself, thus enhancing the inherent stability thereof.

Figures 4A, 4B:
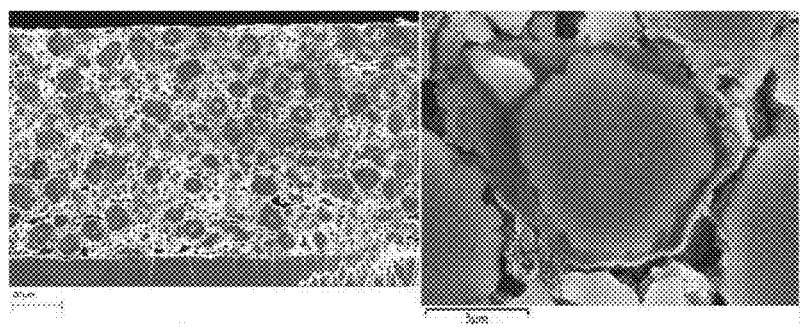

In addition, as hydrophobic functional groups, the multi-benzene rings cover the surface of the perovskite layer to form a dense hydrophobic layer, which can improve the water stability of the perovskite layer. Referring to FIGS. 4a and 4b, the passivation layer covering the surface of the perovskite layer is a dense hydrophobic layer, thereby improving the water stability of the perovskite layer. After energy level matching, the extraction of holes is facilitated, and the capacity of the hole transport layer to extract perovskite holes increases.

Figure 5:
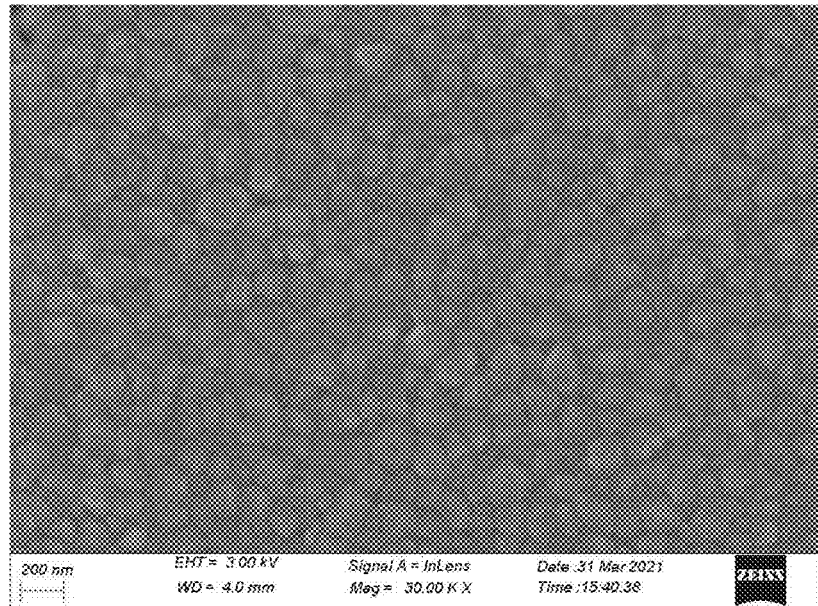
FIG. 5 is a plan view of the perovskite solar cell shown in FIG. 1.
Figure 6:
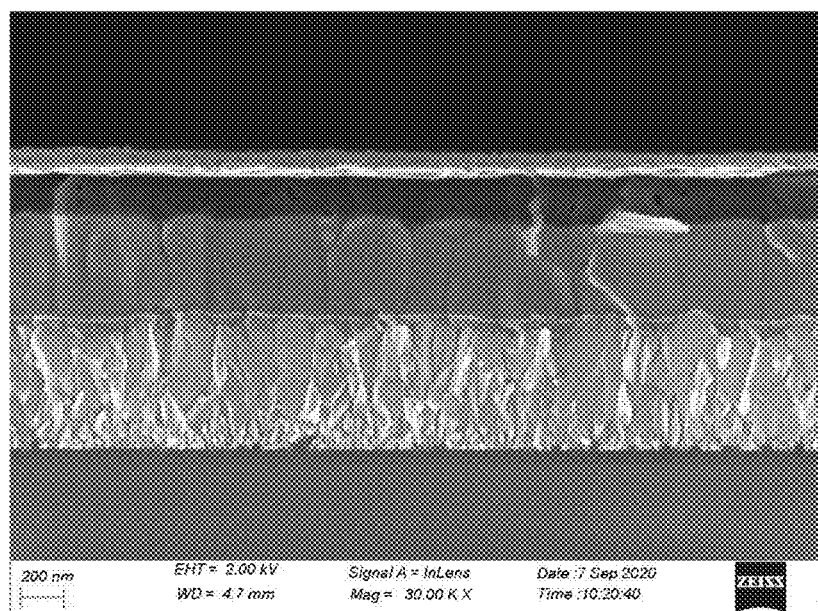
FIG. 6 is a cross-sectional view of the perovskite solar cell shown in FIG. 1.

Referring to FIGS. 5 and 6, it can also be seen that the passivation layer included in the perovskite solar cell of the present application is dense, such that the water stability of the perovskite layer can be improved.

In summary, in the perovskite solar cell of the present application, the surface of the perovskite layer is passivated by using an interface passivation material containing an organic amine salt of a biphenyl compound and/or an organic amine salt of an acene compound to form an interface passivation layer; in addition, the HOMO energy level of the interface between the perovskite layer and the interface passivation layer is 0.01-0.4 eV, and the energy band gap between the HOMO energy level and the LUMO energy level is 0.01-0.4 eV, that is, after energy level matching, the open circuit voltage of the device increases, and after defect passivation, the carrier recombination decreases, and the current increases; in addition, defect passivation and the anchoring of functional groups to perovskite increase the phase stability of perovskite and make it difficult to decompose, and the multi-benzene structure increases the water stability of the perovskite solar cell and obviously improves the long-term stability thereof.

In the perovskite solar cell of the present application, the introduction of different electron-donating groups and electron-withdrawing groups to the organic amine salt of biphenyl compound and/or the organic amine salt of acene compound contained in the interface passivation material can regulate the energy level, wherein:

the electron-donating group is one or more selected from a superstrong electron-donating group, a strong electron-donating group, a medium electron-donating group and a weak electron-donating group:

superstrong electron-donating group: oxygen anion (—O—);

strong electron-donating group: dialkylamino (—NR$_2$), alkylamino (—NHR), amino (—NH$_2$), hydroxyl (—OH), and alkoxy (—OR);

medium electron-donating group: amide group (—NHCOR) and acyloxy (—OCOR); and weak electron-donating group: alkyl (—R), carboxymethyl (—CH$_2$COOH), and phenyl (—Ph), wherein the above-mentioned alkyl has a carbon atom number of 1-10.

In addition, the electron-withdrawing group is one or more selected from a strong electron-withdrawing group, a medium electron-withdrawing group and a weak electron-withdrawing group:

strong electron-withdrawing group: tertiary amine cation (—$N^+R_3$), nitro (—$NO_2$), and trihalomethyl (—$CX_3$), with X=F or Cl;

medium electron-withdrawing group: cyano (—CN) and sulfonic acid group (—$SO_3H$); and weak electron-withdrawing group: formyl (—CHO), acyl (—COR), and carboxyl (—COOH).

With the increase of the number of benzene rings in the organic amine salts of biphenyl compounds and/or the organic amine salts of acene compounds, the difficulty of synthesis becomes higher and higher, and the larger structure may lead to increased steric hindrance. In this regard, the position of energy level can be adjusted by adding electron-donating and electron-withdrawing groups to the benzene ring. In summary, the electron-donating group can improve the HOMO energy level thereof, while the electron-withdrawing group can reduce the LUMO energy level thereof. By means of cooperation with different groups, the energy level position and band gap thereof can be adjusted. By adjusting the energy level of this molecule, the electronic structure of the perovskite layer surface can be adjusted, and the energy level of the perovskite layer is thus adjusted to make it more match with the energy level of the hole transport layer.

Furthermore, in the perovskite solar cell of the present application, the organic amine salts of biphenyl compounds and/or the organic amine salts of acene compounds further have one or more selected from sulfonate ion ($^-SO_3H$), nitrate ion ($NO_3^-$), acetate ion ($CH_3COO^-$), phosphate ion ($PO_4^{3-}$), fluoride ion ($F^-$), iodide ion ($I^-$), bromide ion ($Br^-$) and chloride ion ($Cl^-$), as an anion.

The organic amine compounds of biphenyl compounds and acene compounds are prepared into salts, wherein the biphenyl and acene are used as cations; and the anionic moiety is an alkyl acid containing O, S, P, N, F, I, Br or Cl, such as oleic acid or alkyl sulfonic acid, preferably an acid radical ion containing O, S, P, N, Cl, Br or I. On the one hand, the acid radical ion containing O, S, P, N, Cl, Br or I can form hydrogen bond with the A position in perovskite to stabilize the organic cation; on the other hand, some acid radical ions containing O and S can anchor Pb. The interaction can well stabilize the perovskite phase and has a better effect on the long-term stability of the solar cell. More preferably, the acid radical ions are Cl, Br, and I, and organic acid salts with alkyl chains are particularly preferred as anions.

The anionic moiety is certain for energy level adjustment and interface passivation, If a halogen ion is selected as the anion, the halogen vacancies on the surface of the perovskite layer can be compensated. If an organic acid salt with an alkyl chain is used as the anion, the alkyl chain has the ability to donate electrons, which increases the electronegativity of the anion. On the one hand, the anion can improve the electrostatic interaction with the cation; on the other hand, it can improve the ability to bond with the A and B positions in perovskite so as to stabilize the structure of the perovskite.

Figure 7:
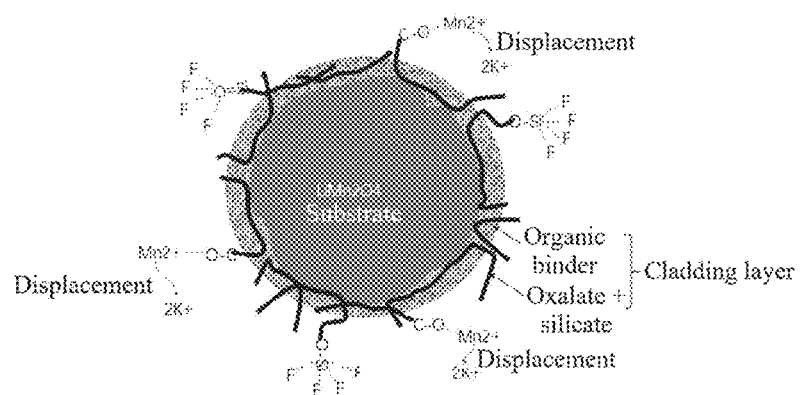
FIG. 7 is a diagram of the passivation principle of a perovskite solar cell according to one embodiment of the present application.

In addition, taking FIG. 7 for example, the anion affects the passivation effect to a certain extent, and the halogen anion can make up for the defects in the X position, wherein F ion can form a hydrogen bond with the cation in the A position to stabilize the cation in the A position. In addition, oxygen-containing acid radicals (such as acetate ions and phosphate ions) can better chelate Pb ion, and can resist oxidation compared with iodide ion, thus avoiding the formation of elementary iodine, a harmful substance.

Method for Preparing Perovskite Solar Cell

A method for preparing the perovskite solar cell of the present application is provided, which comprises, in order, (I) a process of preparing an electron transport layer, (II) a process of preparing a perovskite layer and a passivation layer, (III) a process of preparing a hole transport layer, and (IV) a process of preparing a back electrode, such that the perovskite solar cell of the present application is manufactured, wherein the (II) process of preparing the perovskite layer and the passivation layer comprises (1) respectively preparing a perovskite precursor solution and an anti-solvent solution of an interface passivation material;

(2) on conductive glass spun-coated with the electron transport layer, initially dripping the perovskite precursor solution for spin coating, and then dripping the anti-solvent solution of the interface passivation material for spin coating in a synchronous manner; and (3) performing annealing to form the perovskite layer and the passivation layer.

In process (1), the perovskite precursor is dissolved in a solvent to obtain a perovskite precursor solution, wherein the perovskite precursor comprises: one or more selected from CsBr, FABr, MABr, CsI, FAI, CsCl, FACl, and MACl; and one or more selected from $PbBr_2$, $SnBr_2$, $PbI_2$, $SnI_2$, $PbCl_2$ and $SnCl_2$, wherein the solvent is one or more selected from DMF, DMSO, NMP and GBL. From the point of view of controlling crystallization, it is preferable that the perovskite precursor comprises: a combination of $PbI_2$ and FAI, a combination of $PbI_2$, FAI and MACl, a combination of MAI and $PbI_2$, and a combination of CsI and $PbI_2$; and from the point of view of controlling crystallization, it is preferable that the solvent is two or more selected from DMF, DMSO, NMP and GBL, for example: a combination of DMF and DMSO, and a combination of DMF and NMP.

In process (1), the interface passivation material is dissolved in an anti-solvent to obtain an anti-solvent solution of the interface passivation material, wherein from the point of view of interface passivation, the interface passivation material is preferably one or more selected from p-fluorophenylethylamine, naphthylethylamine, anthrylethylamine, 2-methoxynaphthalene ethylamine hydroiodide, and 2-methoxynaphthalene ethylamine acetate, and more preferably one or more selected from naphthylethylamine, anthrylethylamine, and 2-methoxynaphthalene ethylamine hydroiodide. Furthermore, from the point of view of the degree of difficulty in the dissolution of the solvent from the perovskite precursor solution and the solubility of the interface passivation material, it is preferable that the anti-solvent is one selected from toluene, chlorobenzene, dichlorobenzene, ethyl acetate and diethyl ether.

Figure 8:
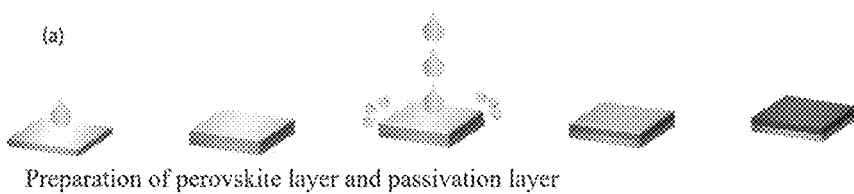
FIG. 8 is a schematic diagram of the process of the preparation of the perovskite layer and the interface passivation layer in a perovskite solar cell of one embodiment of the present application.

The process of preparing the perovskite layer involves dripping a perovskite precursor solution to the electron transport layer, initially performing spin coating, then dripping an anti-solvent solution dissolved with an interface passivation material during spin coating, and performing spin coating in a synchronous manner. The anti-solvent can extract the solvent from the perovskite precursor solution, such that the solute crystal precipitates out, which is namely the perovskite layer. Further taking FIG. 8 for example, the process of preparing the perovskite layer and interface passivation layer involves initially dripping a perovskite precursor solution for spin coating, and after spin coating for a period of time, dripping an anti-solvent solution dissolved with an interface passivation material for spin coating in a synchronous manner, so as to form perovskite and an interface passivation layer at the same time during spin coating.

The interface passivation layer is formed by spin-coating a layer of interface passivation material on the perovskite layer and performing annealing, and it has both the passivation and interface control functions, thus achieving a higher photoelectric conversion efficiency and stability.

From the point of view of the solubility, the dissolution of perovskite, and the difficulty for the solvent, in the anti-solvent solution of the interface passivation material, one or more selected from benzene, anhydrous ethanol, isopropanol, butanol, chloroform, methyl butyrate, anisole, xylene and trimethylbenzene is further added as an additional solvent. Therefore, on the premise of not affecting the perovskite layer, the solvent of the perovskite precursor solution can be well extracted, and the perovskite can be well crystallized.

In addition, in the anti-solvent solution of the interface passivation material, the concentration of the interface passivation material is 0.1-40 mmol/L, and from the point of view of the passivation of the perovskite layer interface, it is preferably 0.5-2 mmol/L, more preferably 0.5-1 mmol/L.

In addition, in process (2), the spin coating period for the perovskite precursor solution is 10-120 seconds. From the point of view of obtaining an excellent perovskite layer, the spin coating period is preferably 10-40 seconds, more preferably 15-30 seconds.

In addition, in process (2), during the process of spin coating with the perovskite precursor solution, the anti-solvent solution of the interface passivation material is dripped. For example, if the spin coating period for the perovskite precursor solution is 45 seconds, then the perovskite precursor solution is dripped in one step at the 0th second of the whole period, only the perovskite precursor solution is then initially spun-coated at the 0-25th seconds, the anti-solvent solution of the interface passivation material is dripped at the 25th second, and the perovskite precursor solution and the anti-solvent solution of the interface passivation material are simultaneously spun-coated at the 25-45th second.

The passivation material is added to an anti-solvent. The thickness of the passivation layer formed on the perovskite surface can be controlled by the concentration and the spin coating period, which can reduce the tedious process of preparing the passivation layer and avoid the influence of multiple annealing on the thin film. Therefore, passivation can be realized during perovskite crystallization. In this regard, the passivation material can better bond with perovskite at the grain boundary and interface to stabilize the perovskite phase, the grain boundary and surface can be passivated at the same time, and the carriers can be prevented from recombination at the grain boundary and interface. If the grain boundary is relatively small, it will be difficult for conventional interface passivation materials to penetrate deep into the grain boundary, and the passivation effect is not good, so it is difficult to completely passivate the defects. In the present application, it is added when the perovskite phase is unstable, which makes it easier to make up for the defects in various positions.

In process (3), the annealing temperature is 100-200° C., and the annealing time is 10-120 min. In addition, before the annealing in process (3), pre-annealing is optionally performed, wherein the pre-annealing temperature is 60-1.50° C., and the pre-annealing time is 30 min or less. In the present application, annealing can be performed only once, or alternatively, pre-annealing is performed once before annealing, which avoids multiple annealing of perovskite in the prior art, saves time and cost, and improves the cell manufacturing efficiency.

In addition, in the method for preparing the perovskite solar cell of the present application, in the (I) process of preparing the electron transport layer, the electron transport layer material solution is spun-coated on the surface of the conductive glass and then annealed to obtain the electron transport layer; in the (III) process of preparing the hole transport layer, the hole transport layer material solution is spun-coated on the surface of the perovskite layer and the passivation layer to obtain the hole transport layer; and in the (IV) process of preparing the back electrode, an electrode position is scraped and evaporated with silver to obtain the back electrode. By means of the above-mentioned processes (I)-(IV), the perovskite solar cell of the present application is obtained.

Power Consuming Device

In addition, the present application further provides a power consuming device, comprising the perovskite solar cell provided by the present application. The perovskite solar cell can be used as a power supply for the power consuming device, or can also be used as an energy storage unit for the power consuming device. The power consuming device can include (1) user solar power supplies: small-sized power supplies ranging from 10 to 100 W used in remote areas without electricity, such as plateaus, islands, pastoral areas, and border guard posts, for military and civilian living electricity, e.g. lighting, television, and radio-cassette recorder, 3-5 KW home roof grid-connected power generation systems, and photovoltaic water pumps that solve the problems of drinking and irrigation by deep wells in areas without electricity. (2) transportation field: for example, beacon lights, traffic/railway signal lights, traffic warning/sign lights, street lights, high-altitude obstacle lights, radio telephone booths on highways/railways, unattended road shift power supplies, etc.; (3) communication/correspondence field: unattended solar microwave relay stations, optical cable maintenance stations, broadcasting/communication/paging power systems; rural carrier telephone photovoltaic systems, small communication machines; GPS power supplies for soldiers, etc.; (4) petroleum, marine and meteorological fields: solar power supply systems for cathodic protection of petroleum oil pipelines and water reservoir gates, living and emergency power supplies for petroleum oil drilling platforms, marine detection equipment, meteorological/hydrological observation equipment, etc.; (5) power supplies for household lamps: yard lights, street lights, hand lamps, camping lights, mountaineering lights, fishing lights, black light lamps, rubber tapping lights, energy-saving lamps, etc.; (6) photovoltaic power stations: 10 KW-50 MW independent photovoltaic power stations, wind-solar (diesel) complementary power stations, charging stations for various large parking lots, etc.; and (7) solar buildings: those that combine solar power generations with building materials to make future large-scale buildings self-sufficient in electricity, without limitation thereto.

EXAMPLES

Hereinafter, the examples of the present application will be explained. The examples described below are exemplary and are merely for explaining the present application, and should not be construed as limiting the present application. The examples in which no techniques or conditions are specified are based on the techniques or conditions described in documents in the art or according to product introductions. The reagents or instruments used therein for which no manufacturers are specified are all conventional products that are commercially available.

Example 1

The method for preparing a perovskite solar cell according to Example 1 involved initially treating conductive glass according to a conventional method, and then performing, in order, (I) the preparation of an electron transport layer, (II) the preparation of a perovskite layer and a passivation layer, (III) the preparation of a hole transport layer, and (IV) the preparation of a back electrode, such that the perovskite solar cell according to Example 1 was manufactured. In particular,

[Treatment of Conductive Glass]

20 pieces of FTO conductive glass with a size of 2.0*2.0 cm were taken, and 0.35 cm FTO was removed at both ends by laser etching to expose a glass substrate.

The etched FTO conductive glass was ultrasonically cleaned several times with water, acetone and isopropanol in order.

The FTO conductive glass was blown with a nitrogen gun to dry off the solvent and put into an ultraviolet ozone machine for further cleaning.

[(I) Preparation of Electron Transport Layer]

A 30% tin oxide colloid was mixed with deionized water at a ratio of 1:3 to form a 10 mg/mL tin oxide colloid aqueous solution, the aqueous solution was stirred at room temperature for 1 h, and 70 µL was taken as an electron transport layer solution, spun-coated on the surface of the FTO conductive glass treated with ultraviolet and ozone at a speed of 4000 rpm/s, heated at 150° C. for 15 min, and annealed on a stage at 150° C. for 15 min to obtain an electron transport layer.

In addition, the compounding proportion of the tin oxide colloid aqueous solution could be adjusted within the range of 30% tin oxide colloid:water=1:1-5.

[(II) Preparation of Perovskite Layer and Passivation Layer]

As shown in Table 1, a perovskite precursor solution was prepared, magnetically stirred at room temperature for 1 h, and filtered for later use. In addition, the interface passivation material was dissolved in an anti-solvent to obtain an anti-solvent solution of the interface passivation material, whereby a perovskite precursor solution and an anti-solvent solution of the interface passivation material were respectively prepared. The above-mentioned FTO conductive glass spun-coated with the electron transport layer was irradiated with UV for 15 min, 60 µL of the perovskite precursor solution was initially dripped on the FTO conductive glass for spin coating; and as shown in Table 1, after spin coating for a period of time, 600 µL of the anti-solvent solution of the interface passivation material was dripped for spin coating in a synchronous manner, followed by annealing at 150° C. for 1 h.

Alternatively, pre-annealing could be performed prior to annealing.

[(III) Preparation of Hole Transport Layer]

Li-TFSI, tBP and FK209 were added to spiro, stirred for 1 h, filtered and used as a hole transport layer material solution for later use, 60 µL of Spiro was dripped on the above-mentioned conductive glass spun-coated with the perovskite layer and the passivation layer, and the hole transport layer material solution was spun-coated to obtain a hole transport layer.

[(IV) Preparation of Back Electrode]

An electrode position was scraped on the above-mentioned cell spun-coated with the hole transport layer, the residual functional layer was wiped off with a washing liquid, and the cell was placed in an evaporation Mask and evaporated with 80 nm silver in a vacuum evaporation device to obtain the perovskite solar cell of the present application.

Examples 2-20

In Examples 2-20, perovskite solar cells were prepared by the same method as in Example 1, except that as shown in Table 1, the following were changed: the perovskite precursor material, the solvent for dissolving the perovskite precursor, the spin coating period for the perovskite precursor solution, the interface passivation material, the anti-solvent, the concentration of the interface passivation material in the anti-solvent, the dripping timing for the anti-solvent solution of the interface passivation material, the optional pre-annealing temperature and time, and the annealing temperature and time.

Comparative Example 1

In Comparative Example 1, a perovskite solar cell was prepared by the same method as in Example 1, except that no interface passivation material was added to the anti-solvent.

Comparative Example 2

In Comparative Example 2, a perovskite solar cell was prepared by the same method as in Example 5, except that the interface passivation material was butylamine iodide.

[Cell Performance Test]

The perovskite solar cells obtained in Examples 1-20 and Comparative Examples 1 and 2 were tested below for cell efficiency, and the results were altogether shown in Table 1.

Cell Efficiency Test Conditions

Spectrum: AM 1.5G spectrum; Light intensity: 1000 W/m$^2$; Room temperature 25° C.

Cell Efficiency Test Process

The solar cell was connected to positive and negative electrodes of a digital source meter, respectively, and the photoelectric conversion efficiency thereof was measured.

TABLE 1

| Experiment item | Perovskite layer | | | Passivation layer | | | | Pre-annealing | | Annealing | | Cell efficiency |
|---|---|---|---|---|---|---|---|---|---|---|---|---|
| | Perovskite precursor | Solvent | Spin coating period | Interface passivation material | Anti-solvent | Concentration (mmol/L) | Dripping timing | Temperature | Time | Temperature | Time | |
| Example 1 | Combination of FAI and PbI2 | Combination of DMF and NMP | 45 seconds (wherein only the perovskite precursor solution was spun-coated at the 0-25th second) | p-Fluorophenethylamine | Chlorobenzene | 0.5 | At the 25th second during the spin-coating of the perovskite precursor solution, the anti-solvent solution of the interface passivation material was dripped, and they were then spun-coated in a synchronous manner from the 25th to 45th seconds in the whole spin-coating period. | — | — | 150° C. | 60 min | 22.32 |
| Example 2 | Combination of FAI and PbI2 | Combination of DMF and NMP | 45 seconds (wherein only the perovskite precursor solution was spun-coated at the 0-25th second) | p-Fluorophenethylamine | Toluene | 0.5 | At the 25th second during the spin-coating of the perovskite precursor solution, the anti-solvent solution of the interface passivation material was dripped, and they were then spun-coated in a synchronous manner from the 25th to 45th seconds in the whole spin-coating period. | — | — | 150° C. | 60 min | 22.12 |
| Example 3 | Combination of FAI and PbI2 | Combination of DMF and NMP | 45 seconds (wherein only the perovskite precursor solution was spun-coated at the 0-25th second) | p-Fluorophenethylamine | Chlorobenzene | 1 | At the 25th second during the spin-coating of the perovskite precursor solution, the anti-solvent solution of the interface passivation material was dripped, and they were then spun-coated in a synchronous manner from the 25th to 45th seconds in the whole spin-coating period. | — | — | 150° C. | 60 min | 22.82 |
| Example 4 | Combination of FAI and PbI2 | Combination of DMF and NMP | 45 seconds (wherein only the perovskite precursor solution was spun-coated at the 0-25th second) | p-Fluorophenethylamine | Chlorobenzene | 2 | At the 25th second during the spin-coating of the perovskite precursor solution, the anti-solvent solution of the interface passivation material was dripped, and they were then spun-coated in a synchronous manner from the 25th to 45th seconds in the whole spin-coating period. | — | — | 150° C. | 60 min | 22.10 |
| Example 5 | Combination of FAI, PbI2 and MACl | Combination of DMF and DMSO | 120 seconds (wherein only the perovskite precursor | Naphthylethylamine | Chlorobenzene | 0.5 | At the 70th second during the spin-coating of the perovskite precursor solution, the anti- | 100° C. | 30 min | 200° C. | 120 min | 23.88 |

TABLE 1-continued

| Experiment item | Perovskite layer | | | Passivation layer | | | | Pre-annealing | | Annealing | | Cell efficiency |
| --- | --- | --- | --- | --- | --- | --- | --- | --- | --- | --- | --- | --- |
| | Perovskite precursor | Solvent | Spin coating period | Interface passivation material | Anti-solvent | Concentration (mmol/L) | Dripping timing | Temperature | Time | Temperature | Time | |
| Example 6 | Combination of FAI, PbI2 and MACl | Combination of DMF and DMSO | 120 seconds (wherein only the perovskite precursor solution was spun-coated at the 0-70th second) | Naphthylethylamine | Ethyl acetate | 0.5 | interface passivation material was dripped, and they were then spun-coated in a synchronous manner from the 70th to 120th seconds in the whole spin-coating period. | 100° C. | 30 min | 200° C. | 120 min | 23.65 |
| Example 7 | Combination of FAI, PbI2 and MACl | Combination of DMF and DMSO | 120 seconds (wherein only the perovskite precursor solution was spun-coated at the 0-70th second) | Naphthylethylamine | Chlorobenzene | 1 | At the 70th second during the spin-coating of the perovskite precursor solution, the anti-solvent solution of the interface passivation material was dripped, and they were then spun-coated in a synchronous manner from the 70th to 120th seconds in the whole spin-coating period. | 100° C. | 30 min | 200° C. | 120 min | 24.09 |
| Example 8 | Combination of FAI, PbI2 and MACl | Combination of DMF and DMSO | 120 seconds (wherein only the perovskite precursor solution was spun-coated at the 0-70th second) | Naphthylethylamine | Chlorobenzene | 2 | At the 70th second during the spin-coating of the perovskite precursor solution, the anti-solvent solution of the interface passivation material was dripped, and they were then spun-coated in a synchronous manner from the 70th to 120th seconds in the whole spin-coating period. | 100° C. | 30 min | 200° C. | 120 min | 23.53 |
| Example 9 | Combination of FAI, PbI2 and MACl | Combination of DMF and DMSO | 120 seconds (wherein only the perovskite precursor solution was spun-coated at the 0-70th second) | Anthrylethylamine | Chlorobenzene | 0.5 | At the 70th second during the spin-coating of the perovskite precursor solution, the anti-solvent solution of the interface passivation material was dripped, and they were then spun-coated in a synchronous manner from the 70th to 120th seconds in the whole spin-coating period. | 100° C. | 30 min | 200° C. | 120 min | 22.65 |

TABLE 1-continued

| Experiment item | Perovskite layer | | | Passivation layer | | | | Pre-annealing | | Annealing | | Cell efficiency |
| --- | --- | --- | --- | --- | --- | --- | --- | --- | --- | --- | --- | --- |
| | Perovskite precursor | Solvent | Spin coating period | Interface passivation material | Anti-solvent | Concentration (mmol/L) | Dripping timing | Temperature | Time | Temperature | Time | |
| Example 10 | Combination of FAI, PbI2 and MACl | Combination of DMF and DMSO | 120 seconds (wherein only the perovskite precursor solution was spun-coated at the 0-70th second) | Anthrylethylamine | Ethyl acetate | 0.5 | At the 70th second during the spin-coating of the perovskite precursor solution, the anti-solvent solution of the interface passivation material was dripped, and they were then spun-coated in a synchronous manner from the 70th to 120th seconds in the whole spin-coating period. | 100° C. | 30 min | 200° C. | 120 min | 22.42 |
| Example 11 | Combination of FAI, PbI2 and MACl | Combination of DMF and DMSO | 120 seconds (wherein only the perovskite precursor solution was spun-coated at the 0-70th second) | Anthrylethylamine | Chlorobenzene | 1 | At the 70th second during the spin-coating of the perovskite precursor solution, the anti-solvent solution of the interface passivation material was dripped, and they were then spun-coated in a synchronous manner from the 70th to 120th seconds in the whole spin-coating period. | 100° C. | 30 min | 200° C. | 120 min | 23.62 |
| Example 12 | Combination of FAI, PbI2 and MACl | Combination of DMF and DMSO | 120 seconds (wherein only the perovskite precursor solution was spun-coated at the 0-70th second) | Anthrylethylamine | Chlorobenzene | 2 | At the 70th second during the spin-coating of the perovskite precursor solution, the anti-solvent solution of the interface passivation material was dripped, and they were then spun-coated in a synchronous manner from the 70th to 120th seconds in the whole spin-coating period. | 100° C. | 30 min | 200° C. | 120 min | 22.12 |
| Example 13 | Combination of GBL and NMP | Combination of GBL and NMP | 90 seconds (wherein only the perovskite precursor solution was spun-coated at the 0-50th second) | 2-Methoxynaphthalene ethylamine hydroiodide | Chlorobenzene | 0.5 | At the 50th second during the spin-coating of the perovskite precursor solution, the anti-solvent solution of the interface passivation material was dripped, and they were then spun-coated in a synchronous manner from the 50th to 90th seconds in the whole spin-coating period. | 70° C. | 15 min | 150° C. | 90 min | 23.88 |
| Example 14 | Combination of GBL and NMP | Combination of GBL and NMP | 90 seconds (wherein only the perovskite precursor solution was spun-coated | 2-Methoxynaphthalene ethylamine hydroiodide | Diethyl ether | 0.5 | At the 50th second during the spin-coating of the perovskite precursor solution, the anti-solvent solution of the interface passivation material was dripped, and they were | 70° C. | 15 min | 150° C. | 90 min | 24.03 |

TABLE 1-continued

| Experiment item | Perovskite layer | | | Passivation layer | | | | Pre-annealing | | Annealing | | Cell efficiency |
|---|---|---|---|---|---|---|---|---|---|---|---|---|
| | Perovskite precursor | Solvent | Spin coating period | Interface passivation material | Anti-solvent | Concentration (mmol/L) | Dripping timing | Temperature | Time | Temperature | Time | |
| Example 15 | Combination of GBL and NMP | Combination of GBL and NMP | 90 seconds (wherein only the perovskite precursor solution was spun-coated at the 0-50th second) | 2-Methoxynaphthalene ethylamine hydroiodide | Chlorobenzene | 1 | then spun-coated in a synchronous manner from the 50th to 90th seconds in the whole spin-coating period. At the 50th second during the spin-coating of the perovskite precursor solution, the anti-solvent solution of the interface passivation material was dripped, and they were then spun-coated in a synchronous manner from the 50th to 90th seconds in the whole spin-coating period. | 70° C. | 15 min | 150° C. | 90 min | 24.32 |
| Example 16 | Combination of GBL and NMP | Combination of GBL and NMP | 90 seconds (wherein only the perovskite precursor solution was spun-coated at the 0-50th second) | 2-Methoxynaphthalene ethylamine hydroiodide | Chlorobenzene | 2 | At the 50th second during the spin-coating of the perovskite precursor solution, the anti-solvent solution of the interface passivation material was dripped, and they were then spun-coated in a synchronous manner from the 50th to 90th seconds in the whole spin-coating period. | 70° C. | 15 min | 150° C. | 90 min | 23.01 |
| Example 17 | Combination of CsI, SnBr2 and SnI2 | GBL | 10 seconds (wherein only the perovskite precursor solution was spun-coated at the 0-5th second) | 2-Methoxynaphthalene ethylamine acetate | Chlorobenzene | 1 | At the 5th second during the spin-coating of the perovskite precursor solution, the anti-solvent solution of the interface passivation material was dripped, and they were then spun-coated in a synchronous manner from the 5th to 10th seconds in the whole spin-coating period. | 40° C. | 5 min | 100° C. | 10 min | 10.32 |
| Example 18 | Combination of CsI and PbI₂ | DMF | 45 seconds (wherein only the perovskite precursor solution was spun-coated at the 0-25th second) | p-Fluorophenethylamine | Chlorobenzene | 0.1 | At the 25th second during the spin-coating of the perovskite precursor solution, the anti-solvent solution of the interface passivation material was dripped, and they were then spun-coated in a synchronous manner from the 25th to 45th seconds in the whole spin-coating period. | — | — | 150° C. | 60 min | 20.63 |
| Example 19 | Combination of CsI and PbI₂ | DMF | 45 seconds (wherein only | p-Fluorophenethylamine | Chlorobenzene | 20 | At the 25th second during the spin-coating of the perovskite | — | — | 150° C. | 60 min | 23.46 |

TABLE 1-continued

| Experiment item | Perovskite layer | | | Passivation layer | | | | Pre-annealing | | Annealing | | Cell efficiency |
| --- | --- | --- | --- | --- | --- | --- | --- | --- | --- | --- | --- | --- |
| | Perovskite precursor | Solvent | Spin coating period | Interface passivation material | Anti-solvent | Concentration (mmol/L) | Dripping timing | Temperature | Time | Temperature | Time | |
| | | | the perovskite precursor solution was spun-coated at the 0-25th second) | | | | precursor solution, the anti-solvent solution of the interface passivation material was dripped, and they were then spun-coated in a synchronous manner from the 25th to 45th seconds in the whole spin-coating period. | | | | | |
| Example 20 | Combination of CsI and PbI₂ | DMF | 45 seconds (wherein only the perovskite precursor solution was spun-coated at the 0-25th second) | p-Fluorophenethylamine | Chlorobenzene | 40 | At the 25th second during the spin-coating of the perovskite precursor solution, the anti-solvent solution of the interface passivation material was dripped, and they were then spun-coated in a synchronous manner from the 25th to 45th seconds in the whole spin-coating period. | — | — | 150° C. | 60 min | 22.02 |
| Comparative Example 1 | Combination of FAI and PbI2 | Combination of DMF and NMP | 45 seconds (wherein only the perovskite precursor solution was spun-coated at the 0-25th second) | — | Chlorobenzene | — | At the 25th second during the spin-coating of the perovskite precursor solution, the anti-solvent solution of the interface passivation material was dripped, and they were then spun-coated in a synchronous manner from the 25th to 45th seconds in the whole spin-coating period. | — | — | 150° C. | 60 min | 19.52 |
| Comparative Example 2 | Combination of FAI, PbI2 and MACl | Combination of DMF and DMSO | 120 seconds (wherein only the perovskite precursor solution was spun-coated at the 0-70th second) | Butylamine iodide | Chlorobenzene | 0.5 | At the 70th second during the spin-coating of the perovskite precursor solution, the anti-solvent solution of the interface passivation material was dripped, and they were then spun-coated in a synchronous manner from the 70th to 120th seconds in the whole spin-coating period. | 100° C. | 30 min | 200° C. | 120 min | 20.03 |

As could be seen from Table 1:

In Examples 1-20, in the preparation of the perovskite solar cells, as for the preparation process of the perovskite layer and passivation layer, the perovskite precursor solution was initially dripped; and after spin coating for a period of time, the anti-solvent solution dissolved with the interface passivation material was then dripped, and after annealing, the perovskite layer and the passivation layer were obtained. The two layers were obtained at one time, which avoided secondary annealing.

From Examples 1-20, it could be seen that in the perovskite solar cell of the present application, the cell efficiency could be greatly improved by using the specific perovskite precursor material, the specific solvent, the specific interface passivation material, the specific anti-solvent, the control of the concentration of the interface passivation material in the anti-solvent, the specific spin-coating period for the perovskite precursor solution, the specific dripping timing for the anti-solvent solution of the interface passivation material, the optional pre-annealing temperature and time, and the annealing temperature and time all within the specific ranges.

In Comparative Example 1, during the preparation of the perovskite solar cell, the perovskite precursor solution was initially dripped; and after spin coating for a period of time, the anti-solvent was dripped, which was pure chlorobenzene free of interface passivation material, and after annealing, the perovskite layer was obtained while no passivation layer was formed. In Comparative Example 2, during the preparation of the perovskite solar cell, the perovskite precursor solution was initially dripped; and after spin coating for a period of time, the anti-solvent was dripped, and after annealing, the perovskite layer was obtained while the passivation layer was formed, wherein the anti-solvent was pure chlorobenzene, and the interface passivation material was butylamine iodide. Compared with Examples 1-20, the cell efficiency was low.

It should be noted that the present application is not limited to the above embodiments. The above embodiments are exemplary only, and any embodiment that has substantially same constitutions as the technical ideas and has the same effects within the scope of the technical solution of the present application falls within the technical scope of the present application. In addition, without departing from the gist of the present application, various modifications that can be conceived by those skilled in the art to the embodiments, and other modes constructed by combining some of the constituent elements of the embodiments also fall within the scope of the present application.

The invention claimed is:

1. A perovskite solar cell, wherein,
the perovskite solar cell has, in order, a back electrode, a hole transport layer, an interface passivation layer, a perovskite layer, an electron transport layer, and conductive glass,
wherein a HOMO energy level difference at an interface between the perovskite layer and the interface passivation layer is 0.01-0.4 eV, and an energy band gap of the interface passivation layer between the HOMO energy level and a LUMO energy level is 1.356-1.689 eV; and
the interface passivation layer comprises an interface passivation material selected from: a biphenyl compound, an organic amine salt of a biphenyl compound, an acene compound, and an organic amine salt of an acene compound.

2. The perovskite solar cell according to claim 1, wherein The biphenyl compound or the organic amine salt of the biphenyl compound has one or more selected from biphenyl, o-terphenyl, m-terphenyl and p-terphenyl, as a parent nucleus.

3. The perovskite solar cell according to claim 1, wherein the acene compound or the organic amine salt of the acene compound has one or more selected from naphthalene, anthracene, phenanthrene, tetracene and pentacene, as a parent nucleus.

4. The perovskite solar cell according to claim 1, wherein the biphenyl compound, the organic amine salt of the biphenyl compound, the acene compound, or the organic amine salt of the acene compound further has an electron-donating group, an electron-withdrawing group, and an alkylamine group, wherein,
the electron-donating group is one or more selected from a superstrong electron-donating group, a strong electron-donating group, a medium electron-donating group, and a weak electron-donating group, wherein,
the superstrong electron-donating group is oxo,
the strong electron-donating group is dialkylamino, alkylamino, amino, hydroxyl, or alkoxy, wherein the alkyl has a carbon atom number 1-10,
the medium electron-donating group is an amide group or acyloxy, and
the weak electron-donating group is alkyl, carboxymethyl, or phenyl; and
the electron-withdrawing group is one or more selected from a strong electron-withdrawing group, a medium electron-withdrawing group, and a weak electron-withdrawing group, wherein,
the strong electron-withdrawing group is tertiary amino, nitro, or trihalomethyl,
the medium electron-withdrawing group is cyano or a sulfonic acid group, and
the weak electron-withdrawing group is acyl or carboxyl.

5. The perovskite solar cell according to claim 1, wherein the organic amine salt of the biphenyl compound, or the organic amine salt of the acene compound further has a cation moiety and an anionic moiety, the cation moiety is one or more selected from an alkyl acid containing at least one of O, S, P, N, F, I, Br, or Cl, a sulfonate ion, a nitrate ion, an acetate ion, a phosphate ion, a fluoride ion, an iodide ion, a bromide ion, and a chloride ion.

6. The perovskite solar cell according to claim 5, wherein the anionic moiety is the alkyl acid containing at least one of O, S, P, N, F, I, Br or Cl, and the alkyl acid is at least one of oleic acid and alkyl sulfonic acid.

7. The perovskite solar cell according to claim 5, wherein the anionic moiety is selected from fluoride ion, iodide ion, bromide ion, and chloride ion.

8. The perovskite solar cell according to claim 1, wherein the interface passivation material is selected from naphthylethylamine, anthrylethylamine, and 2-methoxynaphthalene ethylamine hydroiodide.

9. The perovskite solar cell according to claim 8, wherein the interface passivation material is naphthylethylamine.

10. The perovskite solar cell according to claim 8, wherein the interface passivation material is 2-methoxynaphthalene ethylamine hydroiodide.

11. The perovskite solar cell according to claim 8, wherein the interface passivation material is anthrylethylamine.

12. A power consuming device, wherein
the power consuming device has the perovskite solar cell according to claim 1, and the perovskite solar cell is used as a power source or energy storage unit of the power consuming device.

* * * * *